United States Patent
Schmitt et al.

[11] Patent Number: 5,966,030
[45] Date of Patent: Oct. 12, 1999

[54] OUTPUT BUFFER WITH REGULATED VOLTAGE BIASING FOR DRIVING VOLTAGES GREATER THAN TRANSISTOR TOLERANCE

[75] Inventors: Jonathan Schmitt, Bloomington; Timothy V. Statz, Minneapolis, both of Minn.

[73] Assignee: LSI Logic Corporation, Milpitas, Calif.

[21] Appl. No.: 08/906,357

[22] Filed: Aug. 5, 1997

[51] Int. Cl.⁶ .............................................. H03K 19/0175
[52] U.S. Cl. ................... 326/83; 326/81; 326/68
[58] Field of Search .................. 326/80, 81, 83, 326/68; 327/538, 543, 108

[56] References Cited

U.S. PATENT DOCUMENTS

| | | | |
|---|---|---|---|
| 4,631,426 | 12/1986 | Nelson et al. | 326/80 |
| 4,972,517 | 11/1990 | Kondou et al. | 327/108 |
| 5,266,849 | 11/1993 | Kitahara et al. | 307/475 |
| 5,300,832 | 4/1994 | Rogers | 307/475 |
| 5,321,324 | 6/1994 | Hardee et al. | 307/475 |
| 5,338,978 | 8/1994 | Larsen et al. | 307/443 |
| 5,406,141 | 4/1995 | Yero et al. | 326/68 |
| 5,410,267 | 4/1995 | Haycock et al. | 326/81 |
| 5,418,476 | 5/1995 | Strauss | 326/58 |
| 5,450,025 | 9/1995 | Shay | 326/81 |
| 5,467,031 | 11/1995 | Nguyen et al. | 326/81 |
| 5,532,620 | 7/1996 | Seo et al. | 326/81 |
| 5,537,059 | 7/1996 | Asahina | 326/81 |
| 5,559,464 | 9/1996 | Orii et al. | 327/333 |
| 5,736,869 | 4/1998 | Wei | 326/81 |
| 5,883,538 | 3/1999 | Keeth et al. | 327/333 |

*Primary Examiner*—Michael Tokar
*Assistant Examiner*—Richard Roseen
*Attorney, Agent, or Firm*—Westman, Champlin & Kelly, P.A.

[57] ABSTRACT

An output driver circuit includes first and second supply terminals, first and second complementary data terminals and an output terminal. A pull-up transistor is coupled between the first supply terminal and the output terminal and has a first control terminal. A pull-down transistor is coupled between the second supply terminal and the output terminal and has a second control terminal which is coupled to the second data terminal. A voltage level shifting circuit is coupled between the first complementary data terminal and the first control terminal and is biased between the first supply terminal and a voltage-controlled node. A voltage regulator is coupled to the voltage-controlled node for regulating the node at a selected voltage.

14 Claims, 3 Drawing Sheets

5,966,030

OUTPUT BUFFER WITH REGULATED VOLTAGE BIASING FOR DRIVING VOLTAGES GREATER THAN TRANSISTOR TOLERANCE

BACKGROUND OF THE INVENTION

The present invention relates to semiconductor integrated circuits and, more particularly, to an output buffer which is biased by a voltage regulator for driving voltages that are greater than transistor tolerances.

CMOS integrated circuits are typically provided with tri-state output drivers that are selectively operable between a normal drive mode and a tri-state or high impedance mode in which the drivers appear transparent to the output terminals to which they are connected. Advancements in semiconductor integrated circuit fabrication technology enable the geometries of semiconductor devices to be progressively reduced so that more devices can fit on a single integrated circuit. As a result, core voltages of the integrated circuits are being reduced to prevent damage to the small devices and to reduce overall power consumption. For example, power supplies are now being reduced from 5V to 3.3V, and from 3.3V to 2.5V.

However, low voltage CMOS devices are often interconnected at a board level to TTL logic and other devices that operate at higher supply voltages of 5V or 3.3V. If no precautions are taken, an external 3.3V level signal applied to the output terminal of a 2.5V tri-state driver can cause voltage drops across the transistor devices in the driver that exceed the transistor tolerances, which can cause the gate oxide of the devices to break down. It is therefore desirable to provide an output driver that can drive large voltages off of the integrated circuit without exceeding the tolerance levels of the devices within the driver.

SUMMARY OF THE INVENTION

The output driver circuit of the present invention includes first and second supply terminals, first and second complementary data terminals and an output terminal. A pull-up transistor is coupled between the first supply terminal and the output terminal and has a first control terminal. A pull-down transistor is coupled between the second supply terminal and the output terminal and has a second control terminal which is coupled to the second data terminal. A voltage level shifting circuit is coupled between the first complementary data terminal and the first control terminal and is biased between the first supply terminal and a voltage-controlled node. A voltage regulator is coupled to the voltage-controlled node for regulating the node at a selected voltage.

In one embodiment, the voltage regulator includes a bias voltage generator, a differential amplifier, a pull-down device and an inverter. The differential amplifier has a first input coupled to the bias voltage generator, a second input coupled to the voltage-controlled node and an output. The pull-down device is coupled between the voltage-controlled node and the second supply terminal and has a control terminal. The inverter is coupled between the output of the differential amplifier and the control terminal of the pull-down device.

The voltage level shifting circuit includes a differential transistor pair and a cross coupled inverter. The differential transistor pair defines first and second current paths to the voltage-controlled node and has control terminals coupled to the first and second data terminals, respectively. The cross coupled transistor pair is coupled in the first and second current paths and has a control output terminal coupled to the control terminal of the pull-up transistor.

DETAILED DESCRIPTION OF THE PREFERRED EMBODIMENTS

Figure 1:
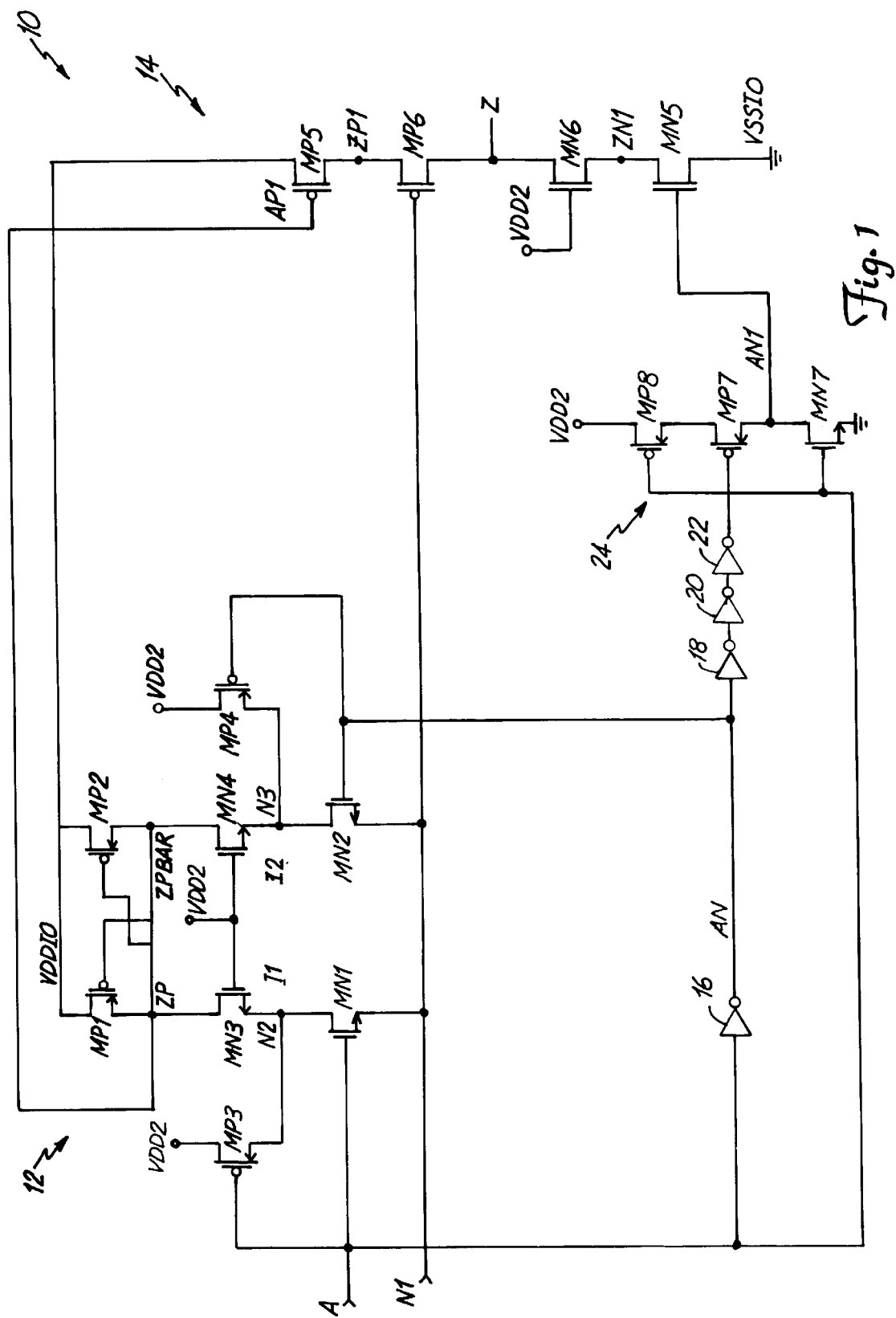
FIG. 1 is a schematic diagram of an output driver according to one embodiment of the present invention.

FIG. 1 is a schematic diagram of an output driver according to one embodiment of the present invention. Output driver 10 forms part of an integrated circuit which has been fabricated with a 2.5V fabrication process, for example. The internal components of the integrated circuit (not shown) supplies a 0–2.5V data signal on data terminal A. Output driver 10 supplies a 0–3.3V output signal on output terminal Z in response to the 0–2.5V data signal on data terminal A.

Output driver 10 is coupled to two pairs of voltage supply or reference terminals VDDIO and VSSIO, and VDD2 and VSS2. Voltage supply terminals VDDIO and VSSIO are coupled across a 3.3V power supply, and voltage supply terminals VDD2 and VSS2 are coupled across a 2.5V power supply. Voltage supply terminals VSSIO and VSS2 are referenced to ground. Output driver 10 includes predriver stage 12 and output driver stage 14. Each transistor in predriver stage 12 and output driver stage 14 is biased such that the gate-to-source, gate-to-bulk and gate-to-drain voltages are all less than a 3.0V tolerance to prevent damage to the transistors while driving or receiving 0–3.3V data signals on output terminal Z. Also, each transistor is biased such that the drain-to-source voltages are less than a 2.75V tolerance for minimum sized transistors.

Predriver stage 12 includes N-channel differential transistor pair MN1 and MN2, N-channel voltage protection transistors MN3 and MN4, P-channel cross-coupled transistor pair MP1 and MP2, charge boosting transistors MP3 and MP4 and inverters 16, 18, 20, 22 and 24. Transistor MN1 has a gate coupled to data terminal A, a source coupled to a locally controlled node N1 and drain coupled to node N2. Inverter 16 is coupled between data terminal A and node AN. Transistor MN2 has a gate coupled to node AN, a source coupled to locally controlled node N1 and a drain coupled to node N3. The drains of transistors MN1 and MN2 define first and second current paths I1 and I2 within predriver stage 12. The gates of voltage protection transistors MN3 and MN4 are coupled to voltage supply terminal VDD2, which is at 2.5V. The sources of transistors MN3 and MN4 are coupled to the drains of transistors MN1 and MN2, respectively. The drains of transistors MN3 and MN4 are coupled to nodes ZP and ZPBAR, respectively.

Transistors MP1 and MP2 are cross-coupled to one another, with the gate of transistor MP1 coupled to the drain of transistor MP2 at node ZPBAR and with the gate of transistor MP2 coupled to the drain of transistor MP1 at node ZP. The sources of transistors MP1 and MP2 are coupled to voltage supply terminal VDDIO, which is at 3.3V. Charge boosting transistor MP3 has a gate coupled to data terminal A, a drain coupled to node N2 and a source coupled to voltage supply terminal VDD2. Charge boosting transistor MP4 has a gate coupled to node AN, a drain coupled to node N3 and a source coupled to voltage supply terminal VDD2.

Output driver stage 14 includes P-channel pull-up transistor MP5, P-channel voltage protection transistor MP6, N-channel pull-down transistor MN5 and N-channel voltage protection transistor MN6, which are coupled together in series between voltage supply terminals VDDIO and VSSIO. Pull-up transistor MP5 has a gate coupled to P-channel control node AP1, which is coupled to node ZP, a source coupled to voltage supply terminal VDDIO and a drain coupled to node ZP1. Voltage protection transistor MP6 has a gate coupled to locally controlled node N1, a source coupled to node ZP1 and a drain coupled to output terminal Z. Voltage protection transistor MN6 has a gate coupled to voltage supply terminal VDD2, a source coupled to node ZN1 and a drain coupled to output terminal Z. Pull-down transistor MN5 has a gate coupled to N-channel control node AN1, a source coupled to voltage supply terminal VSSIO and a drain coupled to node ZN1. Inverters 18, 20, 22 and 24 are coupled together in series between the output of inverter 16 and N-channel control node AN1 to provide a delay line such that pull-up transistor MP5 and pull-down transistor MN5 are not on at the same.

Inverter 24 includes N-channel transistor MN7 and P-channel transistors MP7 and MP8, which are coupled together in series between voltage supply terminal VDD2 and voltage supply terminal VSS2. Transistor MN7 has a gate coupled to data terminal A, a source coupled to voltage supply terminal VSS2 and a drain coupled to N-channel control node AN1. Transistor MP7 has a gate coupled to the output of inverter 22, a drain coupled to N-channel control node AN1 and a source coupled to the drain of transistor MP8. Transistor MP8 has a gate coupled to data terminal A and a source coupled to voltage supply terminal VDD2.

During operation, the data on data terminal A controls the voltage level on output terminal Z by switching pull-up transistor MP5 and pull-down transistor MN5 on and off to pull output terminal Z up to 3.3V or down to 0V. In a traditional output driver, the gates of transistors MP5 and MN5 are driven by the same voltage levels, such as 0–2.5V. When the voltage level is high, pull-down transistor MN5 is on and pull-up transistor MP5 is off. When the voltage level is low, pull-down transistor MN5 is off and pull-up transistor MP5 is on.

With the present invention, pull-down transistor MN5 is driven with a voltage level of 0–2.5V while pull-up transistor MP5 is driven with a shifted voltage level of about 0.8–3.3V. This protects pull-up transistor MP5 and pull-down transistor MN5 from experiencing gate-to-source, gate-to-drain and gate-to-bulk voltage drops of greater than 3.0V over voltage corners.

Predriver stage 12 performs the level shifting operation while protecting each of the transistors in the predriver stage from over voltage conditions. If data terminal A is high, transistor MN1 will be on and transistor MN2 will be off. Transistor MN1 pulls current through current path I1, which discharges nodes N2 and ZP toward the voltage level on locally controlled node N1, which is regulated at a selected voltage level such as 0.8V. Since the sources of transistors MP1 and MP2 are tied to 3.3V, the voltage at nodes ZP and ZPBAR should be held above a certain minimum, such as 0.8V, to prevent an over voltage condition on transistors MP1 and MP2. Extra protection can be obtained by lengthening the gate of transistors MP1 and MP to handle variations in the voltage on voltage supply terminal VDDIO. The low voltage on node ZP turns on transistor MP2 which charges node ZPBAR and node N3 toward 3.3V. Charge boosting transistor MP4 is a pull-up transistor which assists transistor MP2 in charging node N3 when the voltage on data terminal A is high. The high voltage on node ZPBAR turns off transistor MP1. As node N3 reaches an NMOS threshold voltage below the gate of transistor MN4, which is at 2.5V, transistor MN4 turns off and thereafter prevents further charging of node N3.

The low level on node ZP turns on pull-up transistor MP5, which charges node ZP1, output terminal Z and node ZN1 toward 3.3V. Since the gate of voltage protection transistor MP6 is regulated at about 0.8V, the gate-source, gate-drain and gate-bulk voltages are all less than the transistor tolerance of 3.0V when output terminal Z is at 3.3V. As node ZN1 reaches an NMOS threshold voltage below the gate of voltage protection transistor MN6, which is at 2.5V, transistor MN6 turns off. This prevents further charging of node ZN1, which protects pull-down transistor MN5 from an over voltage condition. The logic high level on data terminal A bypasses the delay line formed by inverters 18, 20 and 22 and quickly turns off transistor MN7 of inverter 24 which pulls N-channel control node AN1 low and turns off pull-down transistor MN5 before pull-up transistor MP5 turns on. This prevents transistors MN5 and MP5 from being on at the same time during a low-to-high transition on data terminal A.

Likewise, when data terminal A goes low, transistor MN1 turns off and transistor MN2 turns on. Transistor MN2 discharges nodes N3 and ZPBAR toward 0.8V. The low voltage on node ZPBAR turns on transistor MP1, which charges nodes ZP and N2 toward 3.3V and turns off transistor MP2. Charge boosting transistor MP3 is a pull-up transistor which assists transistor MP1 in charging node N2 when the voltage on data terminal A is low. As node N2 reaches an NMOS threshold above the gate of transistor MN3, which is at 2.5V, transistor MN3 turns off. This prevents further charging of node N2 and thereby protects transistor MN1 from an over voltage condition. The high voltage on node ZP turns off pull-up transistor MP5. The low voltage on data terminal A results in a high voltage on N-channel control terminal AN1 through the delay line formed by inverters 16, 18, 20, 22 and 24. The high voltage on node AN1 turns on pull-down transistor MN5 which discharges node ZN1, output terminal Z and node ZP1 toward 0V. As node ZP1 drops below the voltage on the gate of voltage protection transistor MP6, transistor MP6 turns off, preventing further discharge of node ZP1 and an over voltage condition on transistor MP5.

Figure 2:
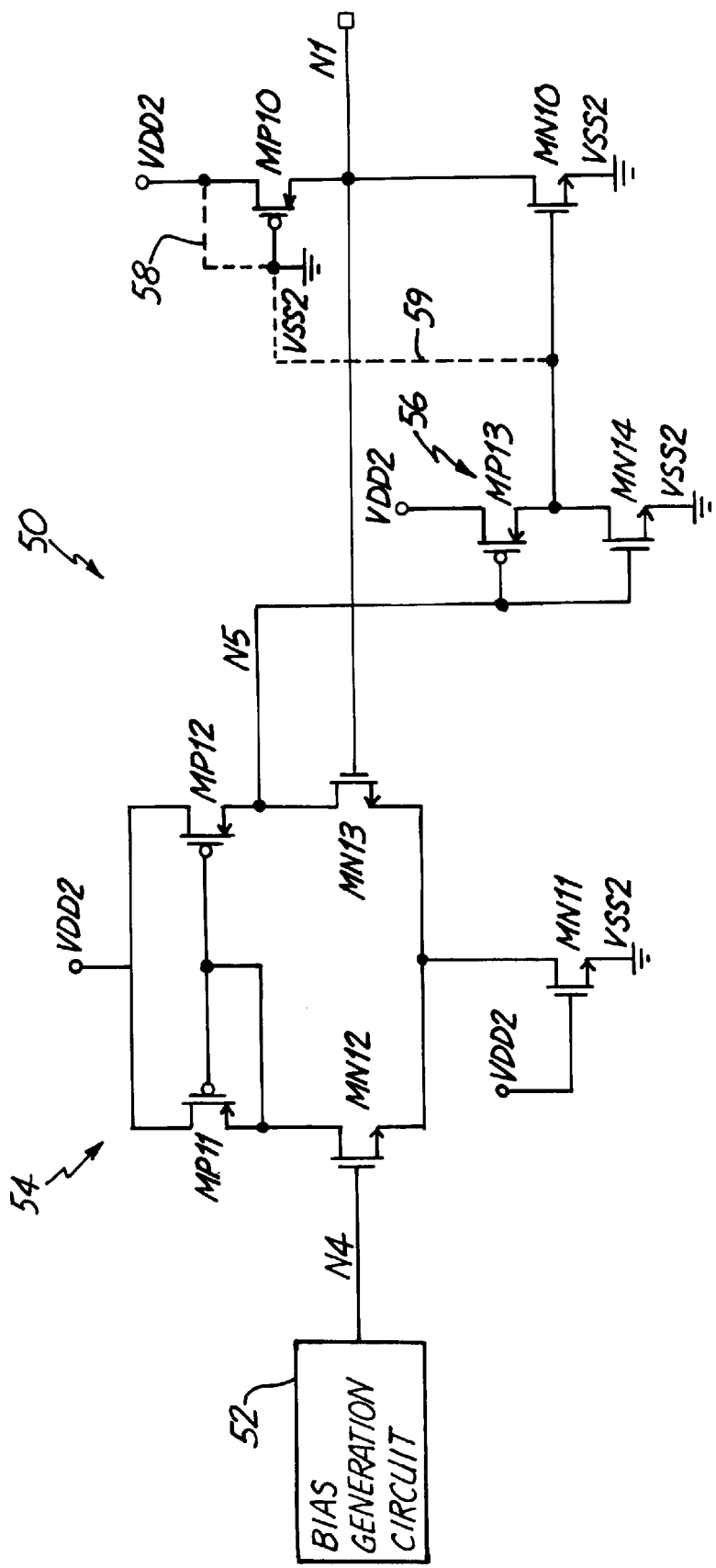
FIG. 2 is a schematic diagram of a voltage regulator for the output driver shown in FIG. 1.

FIG. 2 is a schematic diagram of a voltage regulator for regulating the voltage on locally controlled node N1. Voltage regulator 50 includes bias generation circuit 52, differential amplifier 54, inverter 56, N-channel pull-down transistor MN10 and P-channel pull-up transistor MP10. Bias generation circuit 52 generates a selected bias voltage $V_{BIAS}$ on bias voltage node N4. In one embodiment, bias voltage $V_{BIAS}$ is set to about 0.8V. Bias generation circuit 52 can include any suitable bias generator, such as a resistor tree, a biased current source or a self-fed inverter.

Differential amplifier 54 includes a tail current source formed by N-channel transistor MN11, an N-channel differential transistor pair MN12 and MN13 and a current mirror formed by P-channel transistors MP11 and MP12. Transistor MN11 has a gate coupled to voltage supply terminal VDD2, a source coupled to voltage supply terminal VSS2 and a drain coupled to the sources of transistors MN12 and MN13. Transistor MN12 has a gate coupled to bias voltage node N4 and a drain coupled to the drain and gate of transistor MP11 and the drain at gate of transistor MP12. Transistors MP11 and MP12 have sources which are coupled to voltage supply terminal VDD2. Transistor MP12 has a drain coupled to node N5 and the drain of transistor MN13. Transistor MN13 has a gate coupled to locally controlled node N1.

Inverter 56 is coupled between node N5 and the gate of pull-down transistor MN10 and includes N-channel transistor MN14 and P-channel transistor MP13. Transistor MN14 has a gate coupled to node N5, a source coupled to voltage supply terminal VSS2 and a drain coupled to the gate of pull-down transistor MN10. Transistor MP13 has a gate coupled to node N5, a source coupled to voltage supply terminal VDD2 and a drain coupled to the gate of pull-down transistor MN10. Pull-down transistor MN10 has a source coupled to voltage supply terminal VSS2 and a drain coupled to locally controlled node N1. Pull-up transistor MP10 has a gate coupled to voltage supply terminal VSS2, a source coupled to voltage supply terminal VDD2 and a drain coupled to locally controlled node N1 to provide a weak pull-up current on node N1. In an alternative embodiment, pull-up transistor MP10 is coupled as a diode between voltage supply terminal VDD2 and locally controlled node N1, as shown by dashed line 58.

With this arrangement, bias voltage node N4 is coupled to one side of differential amplifier 54, at the gate of transistor MN12, and locally controlled node N1 is coupled to the other side of differential amplifier 54, at the gate of transistor MN13. If the voltage on locally controlled node N1 becomes greater than bias voltage $V_{BIAS}$, more current is directed through the drain of transistor MN13 than the drain of transistor MN12, which pulls node N5 low. The low voltage on node N5 turns on transistor MP13 of inverter 56 which pulls the gate of pull-down transistor MN10 high. The current flowing through pull-down transistor MN10 increases and pulls locally controlled node N1 back low toward bias voltage $V_{BIAS}$.

To prevent the voltage on locally controlled node N1 from going too low due to back bias voltage capacitance, locally controlled node N1 is tied to a very weak pull-up device, such as transistor MP10. If the voltage on locally controlled node N1 becomes lower than bias voltage $V_{BIAS}$, more current is directed through transistor MN12 than transistor MN13 which turns on transistors MP11 and MP12. Node N5 goes high, which turns on transistor MN14. Transistor MN14 pulls the gate of transistor MN10 low which reduces the current through transistor MN10. The low voltage on locally controlled node N1 turns on transistor MP10 which pulls node N1 back toward bias voltage $V_{BIAS}$.

In an alternative embodiment, pull-up transistor MP10 is controlled by differential amplifier 54 by coupling the gate of transistor MP10 to the output of inverter 56, as shown by dashed line 59. In other alternative embodiments, transistor MP10 can be removed, depending upon the amount of stability required in locally controlled node N1.

An advantage of using a voltage regulator to control the voltage on locally controlled N1 is that the voltage on node N1 is not dependent on the switching thresholds of the process, which makes the output driver 10 more universally applicable. Also, the bias voltage $V_{BIAS}$ is protected from noise on output terminal Z such that the bias voltage $V_{BIAS}$ does not require a large amount of power to generate or maintain. In alternative embodiments, a variety of voltage regulator circuits can be used for controlling the voltage on node N1.

Figure 3:
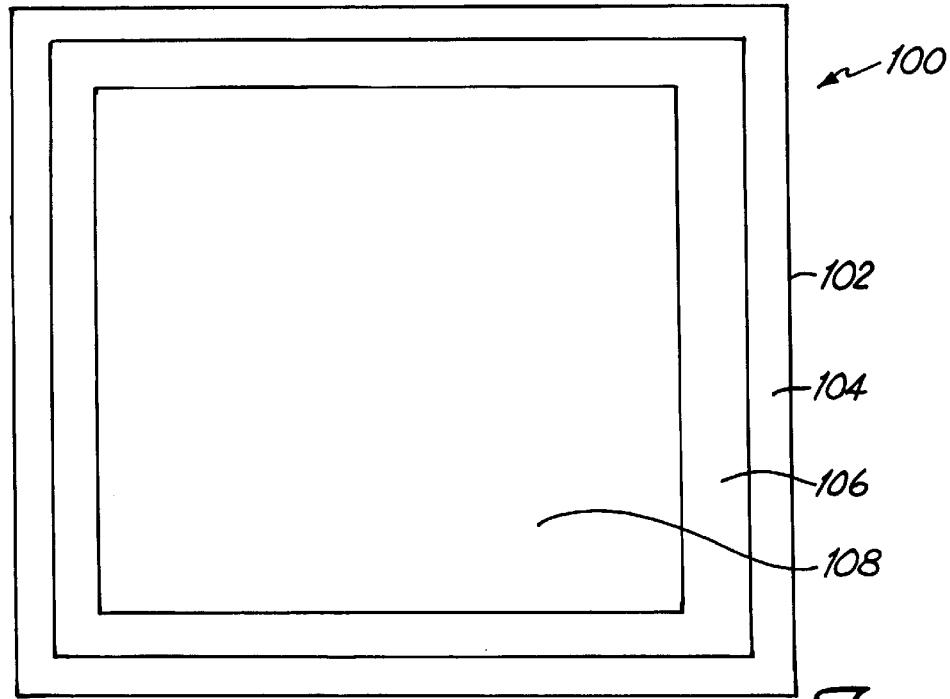
FIG. 3 is a plan view of a semiconductor die on which the circuits shown in FIGS. 1 and 2 are fabricated.

FIG. 3 is a plan view of a semiconductor die on which the circuits shown in FIGS. 1 and 2 are fabricated. Die 100 includes perimeter 102, scribe region 104, I/O region 106 and core region 108. I/O region 106 and core region 108 each have a plurality of semiconductor devices or cells. I/O region 106 extends along scribe region 104 and surrounds core region 108. Die 100 has a plurality of routing layers for routing interconnections between the devices within I/O region 106 and core region 108. Each interconnection or "wire" includes one or more segments of conductive material which are routed in a specified pattern within the various routing layers on die 100.

Figure 4:
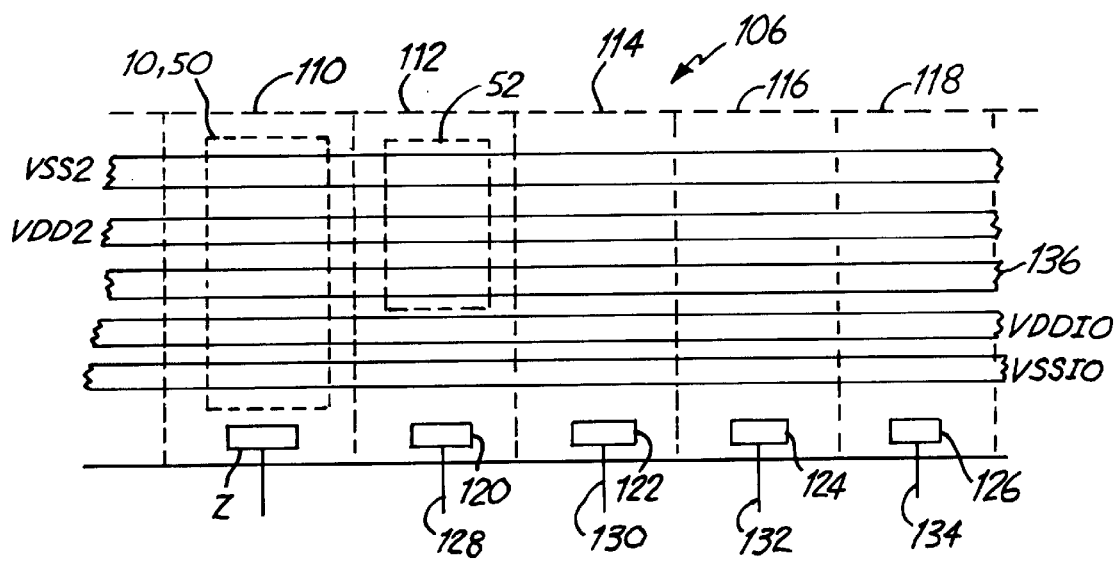
FIG. 4 is a plan view of an I/O cell of the semiconductor die shown in FIG. 3.

FIG. 4 is a plan view of an I/O slot 110 and power slots 112, 114, 116 and 118 within I/O region 106. Power supply buses VDDIO, VSSIO, VDD2 and VSS2 extend along I/O region 106, generally parallel to perimeter 102. VDDIO and VSSIO supply power to the semiconductor devices within I/O region 106, and VDD2 and VSS2 supply power to the semiconductor devices within core region 108.

Output driver 10 and voltage regulator 50 are fabricated within I/O slot 110. In the embodiment shown in FIG. 4, bias generation circuit 52 is fabricated in one of the power slots, such as slot 112. Bias generation circuit 52 is coupled to the bias voltage nodes N4 of a plurality of voltage regulators 50 in a plurality of I/O slots 110 through a global bus 136 which is routed along the power supply buses VDDIO, VSSIO, VDD2 and VSS2 within I/O region 106. In an alternative embodiment, bias generation circuit 52 is fabricated with voltage regulator 50 in each I/O slot 110. In another embodiment, bias generation circuit 52 is located off-chip, and the bias voltage $V_{BIAS}$ is supplied to die 100 through one of the package pins.

Power and ground pads 120, 122, 124 and 126 are positioned along perimeter 102 within power and ground slots 112, 114, 116 and 118. Power and ground pads 120 and 122 are coupled to power supply buses VDDIO and VSSIO, respectively. Power and ground pads 124 and 126 are coupled to power supply buses VDD2 and VSS2, respectively. Power and ground pads 120, 122, 124 and 126 provide a connection to leads 128, 130, 132 and 134 which extend to the power and ground pins of the integrated circuit package in which the die is housed.

Although the present invention has been described with reference to preferred embodiments, workers skilled in the art will recognize that changes may be made in form and detail without departing from the spirit and scope of the invention. For example, the output driver circuit can be implemented with various technologies other than CMOS and with various circuit configurations. The transistors in the output driver circuit can include individual transistors or an array of transistors coupled together in parallel with one another. Also, the voltage supply terminals can be relatively positive or relatively negative, depending upon the particular convention adopted and the technology used. The terms "pull-up" and "pull-down" used in the specification and the claims are arbitrary terms and can refer to either a logic high level or a logic low level depending upon the relative levels of the voltage supply terminals. Likewise, the term "coupled" can include various types of connections or couplings and can include a direct connection or a connection through one or more intermediate components.

What is claimed is:

1. An output driver circuit comprising:
   first and second supply terminals;
   first and second complementary data terminals;
   an output terminal;

a pull-up transistor and a pull-down transistor which are coupled to the output terminal, between the first and second supply terminals, and have first and second control terminals, respectively, with the second control terminal coupled to the second data terminal;

a voltage level shifting circuit coupled between the first complementary data terminal and the first control terminal and biased between the first supply terminal and a voltage-controlled node; and a voltage regulator coupled to the voltage-controlled node and regulating the node at a selected voltage.

2. The output driver circuit of claim 1 wherein the voltage regulator comprises:

a bias voltage generator;

a differential amplifier having a first input coupled to the bias voltage generator, a second input coupled to the voltage-controlled node and an output; and a pull-down device coupled between the voltage-controlled node and the second supply terminal and having a control terminal coupled to the output of the differential amplifier.

3. The output driver circuit of claim 2 wherein the voltage regulator further comprises:

an inverter coupled between the output of the differential amplifier and the control terminal of the pull-down device; and wherein the pull-down device comprises an N-channel transistor.

4. The output driver circuit of claim 2 wherein the voltage regulator further comprises:

a diode coupled between the first supply terminal and the voltage-controlled node.

5. The output driver circuit of claim 2 wherein the voltage regulator further comprises:

a pull-up device coupled between the voltage-controlled node and the first supply terminal and having a control terminal; and an inverter coupled between the output of the differential amplifier and the control terminals of the pull-down device and the pull-up device.

6. The output driver circuit of claim 1 wherein the voltage regulator further comprises:

a self-fed inverter having an input and an output which are coupled to the voltage-controlled node.

7. The output driver circuit of claim 1 wherein the voltage level shifting circuit comprises:

a differential transistor pair coupled to the voltage-controlled node and defining first and second current paths, the differential transistor pair having control terminals coupled to the first and second data terminals, respectively; and a cross coupled transistor pair coupled in the first and second current paths and having a control output terminal coupled to the control terminal of the pull-up transistor.

8. The output driver circuit of claim 7 and further comprising:

a first voltage reference terminal having a selected voltage level; and first and second n-channel voltage protection transistors coupled in the first and second current paths, respectively, between the differential transistor pair and the cross coupled transistor pair and having control terminals coupled to the first reference voltage terminal.

9. The output driver circuit of claim 7 and further comprising:

a first voltage reference terminal having a selected voltage level;

a first charge boosting transistor coupled between the first voltage reference terminal and the first current path at a node between the cross coupled transistor pair and the differential transistor pair, wherein the first charge boosting transistor is biased by the second complementary data terminal; and a second charge boosting transistor coupled between the first voltage reference terminal and the second current path at a node between the cross coupled transistor pair and the differential transistor pair, wherein the second charge boosting transistor is biased by the first complementary data terminal.

10. The output driver circuit of claim 1 and further comprising:

a first voltage protection transistor coupled between the pull-up transistor and the output terminal and having a control terminal coupled to the voltage-controlled node.

11. The output driver circuit of claim 10 and further comprising:

a first voltage reference terminal having a selected voltage level; and a second voltage protection transistor coupled between the output terminal and the pull-down transistor and having a control terminal coupled to the first voltage reference terminal.

12. The output driver of claim 1 and further comprising:

a delay line formed by a plurality of inverters coupled together in series between the second data terminal and the second control terminal of the pull-down transistor.

13. An output driver circuit comprising:

first and second supply terminals;

first and second complementary data terminals;

an output terminal;

a pull-up transistor and a pull-down transistor which are coupled to the output terminal and have first and second control terminals, respectively, with the second control terminal coupled to the second data terminal;

a differential transistor pair coupled to a voltage-controlled node and defining first and second current paths, the differential transistor pair having control terminals coupled to the first and second data terminals, respectively;

a cross coupled transistor pair coupled in the first and second current paths, between the first supply terminal and the differential transistor pair, and having a control output terminal coupled to the control terminal of the pull-up transistor; and a voltage regulator coupled to the voltage-controlled node.

14. The output driver circuit of claim 13 wherein the voltage regulator comprises:

a bias voltage generator;

a differential amplifier having a first input coupled to the bias voltage generator, a second input coupled to the voltage-controlled node and an output;

a pull-down device coupled between the voltage-controlled node and the second supply terminal and having a control terminal; and an inverter coupled between the output of the differential amplifier and the control terminal of the pull-down device.

* * * * *